(12) United States Patent
Wang

(10) Patent No.: US 10,915,030 B2
(45) Date of Patent: Feb. 9, 2021

(54) LIGHT-SPOT DISTRIBUTION STRUCTURE, SURFACE SHAPE MEASUREMENT METHOD, AND METHOD FOR CALCULATING EXPOSURE FIELD-OF-VIEW CONTROL VALUE

(71) Applicant: SHANGHAI MICRO ELECTRONICS EQUIPMENT (GROUP) CO., LTD., Shanghai (CN)

(72) Inventor: Zhenhui Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/071,943

(22) PCT Filed: Jan. 19, 2017

(86) PCT No.: PCT/CN2017/071728
§ 371 (c)(1),
(2) Date: Jul. 23, 2018

(87) PCT Pub. No.: WO2017/125044
PCT Pub. Date: Jul. 27, 2017

(65) Prior Publication Data
US 2019/0025711 A1 Jan. 24, 2019

(30) Foreign Application Priority Data

Jan. 22, 2016 (CN) .......................... 2016 1 0044316

(51) Int. Cl.
*G03F 7/20* (2006.01)
*G03F 9/00* (2006.01)

(52) U.S. Cl.
CPC ........ *G03F 7/70258* (2013.01); *G03F 7/7055* (2013.01); *G03F 7/70516* (2013.01);
(Continued)

(58) Field of Classification Search
CPC .... G03F 7/70258; G03F 7/20; G03F 7/70516; G03F 7/7055; G03F 7/70616; G03F 9/7023; G03F 9/7046; G03F 9/7065
(Continued)

(56) References Cited

U.S. PATENT DOCUMENTS

| 5,117,255 A | 5/1992 | Shiraishi et al. |
| 5,448,332 A * | 9/1995 | Sakakibara ......... G03F 7/70358 250/201.4 |

(Continued)

FOREIGN PATENT DOCUMENTS

| CN | 101183222 A | 5/2008 |
| CN | 101276160 A | 10/2008 |

(Continued)

*Primary Examiner* — Isiaka O Akanbi
(74) *Attorney, Agent, or Firm* — Muncy, Geissler, Olds & Lowe, P.C.

(57) ABSTRACT

A light spot arrangement, a surface profile measuring method and a method for calculating control data for an exposure field are disclosed. The light spot arrangement includes a plurality of measuring light spots (100) which define at least one set of orthogonal line segments, wherein the measuring light spots (100) lying on the orthogonal line segments radiate outward from a center, with each of the orthogonal line segments defined by at least four measuring light spots. With this light spot arrangement comprising at least one set of orthogonal line segments defined by measuring light spots radiating outward from a center, readings of multiple ones of the light spots (100) can be acquired in real time, and exposure can be performed with real-time focusing and leveling based on a surface profile of the wafer (200) derived from a surface fitting process carried out on the readings.

12 Claims, 12 Drawing Sheets

(52) U.S. Cl.
CPC ........ *G03F 7/70616* (2013.01); *G03F 9/7023* (2013.01); *G03F 9/7046* (2013.01); *G03F 9/7065* (2013.01)

(58) Field of Classification Search
USPC .................................................. 356/610–624
See application file for complete search history.

(56) References Cited

U.S. PATENT DOCUMENTS

| | | | | |
|---|---|---|---|---|
| 5,461,237 | A * | 10/1995 | Wakamoto | G03F 7/707 250/548 |
| 5,521,036 | A * | 5/1996 | Iwamoto | G03F 9/7026 250/548 |
| 6,195,154 | B1 * | 2/2001 | Imai | G03F 9/7034 355/53 |
| 6,674,510 | B1 * | 1/2004 | Jasper | G03F 9/7026 355/55 |
| 2002/0159621 | A1 * | 10/2002 | Callies | A61B 3/13 382/128 |
| 2004/0130691 | A1 * | 7/2004 | Boonman | G03F 9/70 355/53 |
| 2007/0041508 | A1 * | 2/2007 | Tubbs | A61B 6/08 378/207 |
| 2007/0099099 | A1 | 5/2007 | Onvlee et al. | |
| 2007/0285663 | A1 * | 12/2007 | Hewitt | H04N 13/398 356/399 |
| 2009/0225331 | A1 | 9/2009 | Van Haren | |
| 2012/0154794 | A1 * | 6/2012 | Wen | G01S 3/781 356/123 |

FOREIGN PATENT DOCUMENTS

| | | |
|---|---|---|
| CN | 101344727 A | 1/2009 |
| CN | 101344727 A | 1/2009 |
| CN | 101470359 A | 7/2009 |
| CN | 102736430 A | 10/2012 |
| CN | 102736430 A | 10/2012 |
| JP | H 0969480 A | 3/1997 |
| JP | 2006300676 A | 11/2006 |

* cited by examiner

LIGHT-SPOT DISTRIBUTION STRUCTURE, SURFACE SHAPE MEASUREMENT METHOD, AND METHOD FOR CALCULATING EXPOSURE FIELD-OF-VIEW CONTROL VALUE

TECHNICAL FIELD

The present invention relates to a light spot arrangement, a surface profile measuring method and a method for calculating control data for an exposure field, for use in the field of photolithography technology.

BACKGROUND

A projection photolithography machine is a device for projecting a pattern on a photomask onto the surface of a wafer by using a projection objective. The performance of an exposure process carried out by a photolithography machine will be seriously impaired if some areas of the wafer surface in an exposure field are not within an effective depth of focus (DOF) due to a deviation or tilt of the wafer from a focal plane of the objective. For this reason, a focusing and leveling system is required for precise control. There are two common methods available for focusing and leveling. In the first method, a particular light spot arrangement is used for real-time height and tilt measurement of a wafer stage during the exposure process accompanied with focusing and leveling control performed on the wafer stage based on the measurement results. In the second method, prior to the exposure process, multiple light spots are used to measure a surface profile of the wafer in the exposure field, and values for motion control during the exposure process are calculated based on the measured surface profile.

For the first method, the particular light spot arrangement is often designed for a certain exposure field and is inadaptable to various exposure fields of different sizes. Additionally, the particular light spot arrangement may not work during the exposure of an edge of the wafer. The method is also unsuitable for surface profile scanning, and therefore has a relatively low efficiency.

In the second method, the light spots are arranged in a linear pattern, in which the outermost two spots are used to measure the height of the wafer stage to make sure that the wafer stage is maintained in an effective DOF range, and the other light spots are used to scan and measure the surface profile of the wafer. Control data are calculated based on the measurements and then the exposure is performed. During edge exposure, the system must be decelerated to avoid the outermost spots from moving beyond the wafer edge and thus becoming invalid. This method, however, suffers from a low scanning speed, a long cycle time, lower efficiency and incapability of allowing real-time focusing and leveling.

During exposure control, as the light spots will become invalid when they move out of the wafer, the multiple light spots cannot be used to directly control the exposure of an edge field, in this case a reference field is usually adopted, so that exposure control data obtained from an internally adjacent field are used as the exposure control data for the edge field. This approach is, however, not suitable for use in exposing, with a small DOF, wafers with great differences in surface conditions between the edge and the adjacent portions, such as those with edge warpage, because defocus tends to occur during edge exposure in such cases.

In practical application scenarios, various photolithography machines are used to expose wafers of different sizes typically with differently-sized exposure fields. Therefore, there is a need for a light spot arrangement, a surface profile measuring method and a method for calculating control data for an exposure field, which are adaptive to more photolithography conditions and applicable both in real-time surface profile measurement and scanning surface profile measurement, so that light spot-based measuring devices employing them can have better versatility and applicability.

SUMMARY OF THE INVENTION

It is an object of the present invention to provide a light spot arrangement, a surface profile measuring method and a method for calculating control data for an exposure field, which are capable of improving scanning efficiency, suitable for use both in real-time surface profile measurement and in scanning surface profile measurement and adaptive to exposure fields of various sizes.

To this end, the subject matter of the present invention lies in:

a light spot arrangement, comprising a plurality of measuring light spots which define at least one set of orthogonal line segments, wherein the measuring light spots lying on the orthogonal line segments radiate outward from a center, with each of the orthogonal line segments defined by at least four measuring light spots. The measuring light spots are used to measure a profile of a planer surface.

Preferably, the measuring light spots constitute a pattern of a slash (/), a backslash (\), a greek cross, the union jack or the letter X, wherein the pattern of the union jack is made up of two sets of orthogonal line segments intersecting each other.

Preferably, the measuring light spots constitute a pattern of a rotated cross.

Preferably, the rotated cross is a greek cross that is rotated counterclockwise by an angle ranging from 18° to 35°.

Preferably, the measuring light spots radiate outward from the center in an equidistant manner.

A surface profile measuring method, using the light spot arrangement as defined above, comprises the steps of:

1) causing a wafer stage to perform an exposure scan movement, obtaining readings of each of the measuring light spots in the light spot arrangement, and collecting height values and horizontal positions of each of the measuring light spots at different time instants; and 2) converting the readings of each of the measuring light spots into coordinate values in a coordinate system of the wafer stage, and taking the coordinate values as original surface profile data obtained from a scan measurement using the measuring light spots.

Preferably, some or all of the measuring light spots are designated as valid light spots based on a validity of each measuring light spot, wherein the readings of measuring light spots are obtained from the valid light spots.

Preferably, the validity of the measuring light spot is designated in a hardware or software manner.

Preferably, in step 1, the scan is performed with a height and a tilt of the wafer stage remaining unchanged and following a path adopting a grid-like pattern, a pattern consisting of curved line segments or a starburst pattern.

Preferably, in step 2, the horizontal positions in the readings of the measuring light spots are converted to horizontal coordinate values in the coordinate system of the wafer stage according to following Equations 1 and 2:

$$X_{[n][i]} = X_{WS[n]} + X_{spot[i]} \qquad \text{(Eqn. 1)}$$

$$Y_{[n][i]} = Y_{WS[n]} + Y_{spot[i]} \qquad \text{(Eqn. 2)}$$

where, $X_{[n][i]}$ and $Y_{WS[n]}$ respectively denote horizontal X-position and Y-direction of a center of an exposure field at n-th time instant, $X_{spot[i]}$ and $Y_{spot[i]}$ respectively represent horizontal X-position and Y-position of i-th light spot relative to the center of the exposure field, $X_{[n][i]}$ and $Y_{[n][i]}$ respectively denote horizontal coordinate values of the i-th light spot in the coordinate system of the wafer stage at the n-th time instant, wherein n and i are both natural numbers.

Preferably, in step 2, the height values in the readings of the measuring light spots are converted to vertical coordinate values in the coordinate system of the wafer stage according to following Equation 3 or Equation 4:

$$Z_{[n][i]} = Z_{WS[n]} + Z_{[n]spot[i]} \qquad (\text{Eqn. 3})$$

if the wafer stage does not tilt in step 1; or $$Z_{[n][i]} = Z_{WS[n]} + Z_{[n]spot[i]} + Rx_{WS[n]} \times Y_{spot[i]} - Ry_{WS[n]} \times X_{spot[i]} \qquad (\text{Eqn. 4})$$

if the wafer stage does not tilt in step 1; or where, $Z_{WS[n]}$ denotes a vertical position of the center of an exposure field at the n-th time instant, $Z_{[n]spot[i]}$ denotes a measured height value of i-th measuring light spot at the n-th time instant, $Rx_{WS[n]}$ and $Ry_{WS[n]}$ respectively denote X-tilt and Y-tilt of a center of the exposure field at the n-th time instant, $X_{spot[i]}$ and $Y_{spot[i]}$ respectively denote horizontal X-position and Y-position of the i-th light spot relative to the center of the exposure field, $Z_{[n][i]}$ denotes a height coordinate value of the i-th light spot in the coordinate system of the wafer stage at the n-th time instant, wherein n and i are both natural numbers.

A method for calculating control data for an exposure field, comprising using the surface profile measuring method as defined above to obtain the original surface profile data, and processing the original surface profile data to obtain the control data of the exposure field for the wafer stage. The processing comprises the steps of:

3) fitting the original surface profile data using a mathematical fitting model to obtain dense point surface profile data that are within an allowable tolerance range; and 4) performing surface fitting based on the dense point surface profile data according to a predetermined threshold, wherein if the number of valid dense points within the exposure field is greater than the threshold, surface fitting is directly performed based on the corresponding dense point surface profile data; otherwise, if the number of valid dense points within the exposure field is smaller than the threshold, before surface fitting is performed based on the corresponding dense point surface profile data, the exposure field is incrementally shifted inward or supplemented with adjacent candidate data points and each supplementation is followed by fitting the original surface profile data with the mathematical fitting model until number of valid dense points reaches the threshold.

Preferably, the method for calculating control data for an exposure field further comprises, prior to step 3, pre-processing of the original surface profile data, wherein the pre-processing includes removal of extreme values.

Preferably, in step 3, the mathematical fitting model is a linear interpolation model, a high-order surface fitting model or a Zernike model.

Preferably, the surface fitting in step 4 is given by:

$$Z = Z_0 - Ry \times X + Rx \times Y$$

where, X, Y and Z denote a dense point surface profile data; $Z_0$ denote a height value of the surface profile in the exposure field; Rx denote a X-tilt of the surface profile in the exposure field; Ry denote a Y-tilt of the surface profile in the exposure field; and $Z_0$, Rx and Ry denote control data for the exposure field derived from proper conversion.

In comparison with the conventional solutions, use of the light spot arrangement comprising at least one set of orthogonal line segments according to the present invention not only allows measure readings of a plurality of light spots therein to be acquired in real time but also enables the exposure to be performed with real-time focusing and leveling based on a surface profile of the wafer containing height and tilt data obtained from a surface fitting procedure. Moreover, each individual light spot in the light spot arrangement can be set to be valid or invalid as desired, making the arrangement adaptive to exposure fields of different sizes. During a scan movement performed by the wafer stage, readings of valid light spots are obtained and converted into coordinate values in the coordinate system of the wafer stage, which are taken as original surface profile data of scanning measurement of the wafer stage. The original surface profile data are then processed to derive control data for the exposure field of the wafer stage, which serve as a basis for the exposure with focusing and leveling. In this process, as it is unnecessary to take into account whether readings of all the light spot are valid during the scanning of the wafer edge, the scan can be performed at a higher speed, resulting in an improvement in scanning efficiency. Therefore, the present invention allows both real-time measurement and scanning measurement of surface profile and is thus more versatile and adaptive.

In these figures: 100, a light spot; 101, an exposure field; 102, an illumination field of a light spot projector; 103, a scan path; 111, a first exposure field; 112, a second exposure field; 113, a third exposure field; 200, a wafer; 300, a wafer stage; and 400, the light spot projector.

DETAILED DESCRIPTION

The present invention will be described in detail below with reference to the accompanying drawings.

Figure 1:
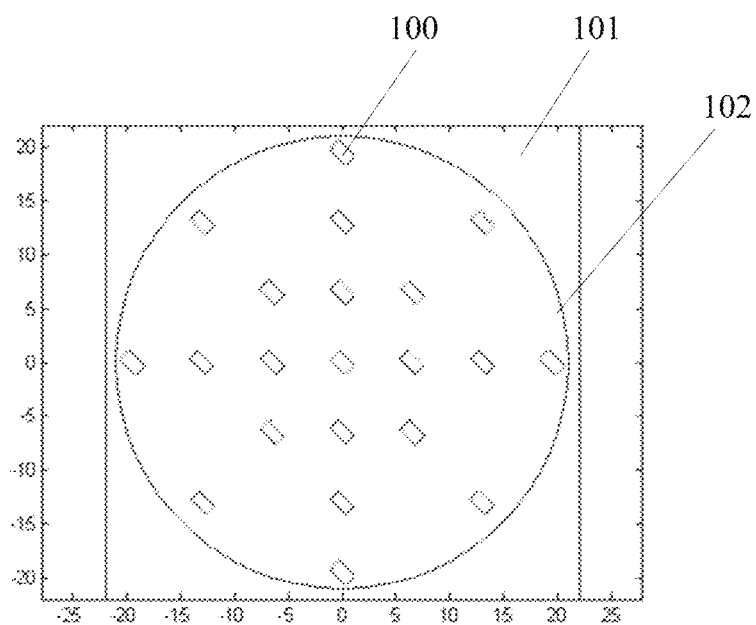
FIG. 1 is a schematic illustration of a light spot arrangement adopting a shape of the union jack according to an embodiment of the present invention.
Figure 4:
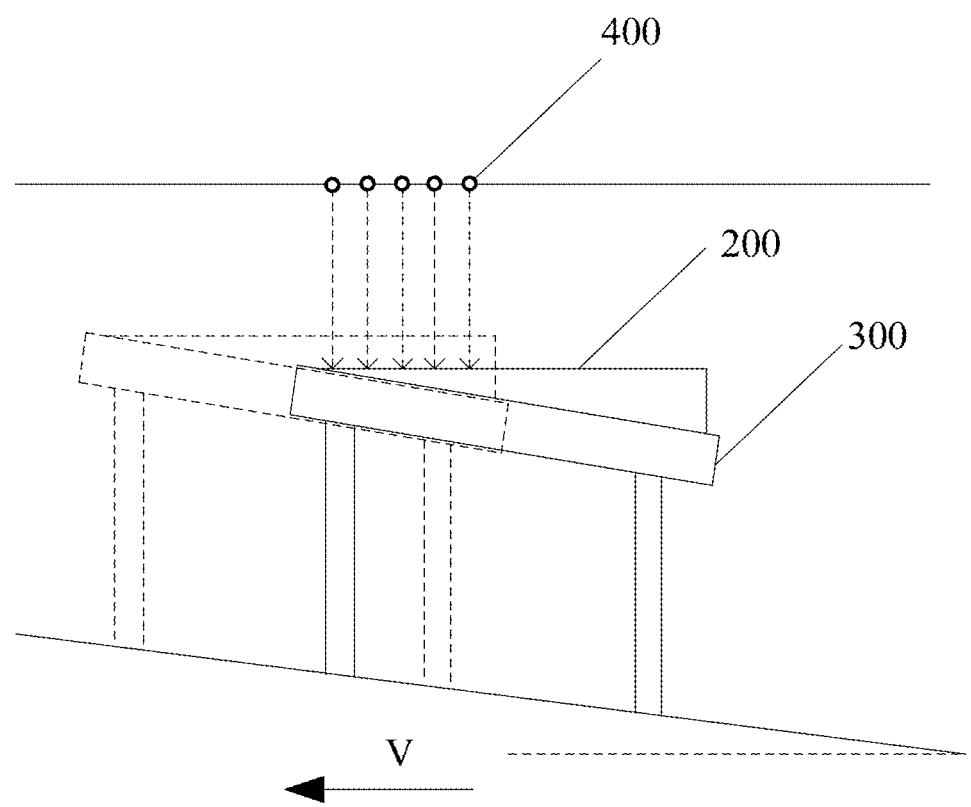
FIG. 4 schematically shows how surface profile data are measured by a light spot-based measuring system according to an embodiment of the present invention.
Figure 5:
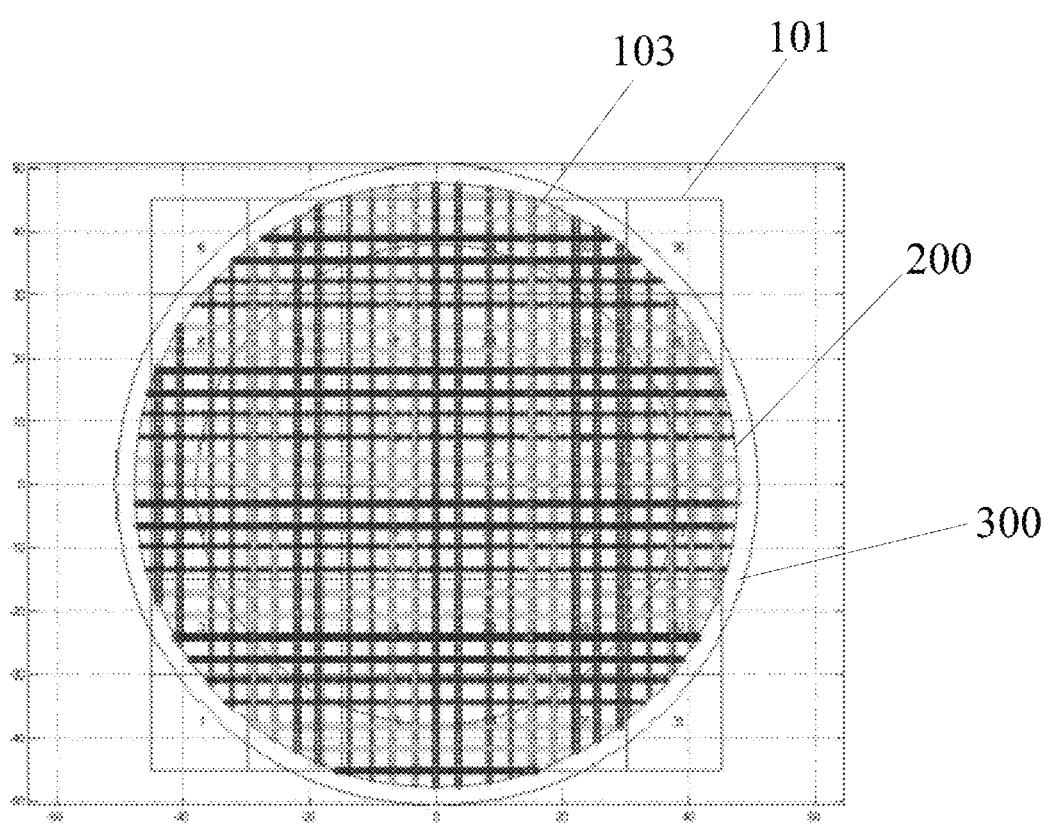
FIG. 5 is a schematic illustration of a scan path adopting a grid-like pattern according to an embodiment of the present invention.
Figure 6:
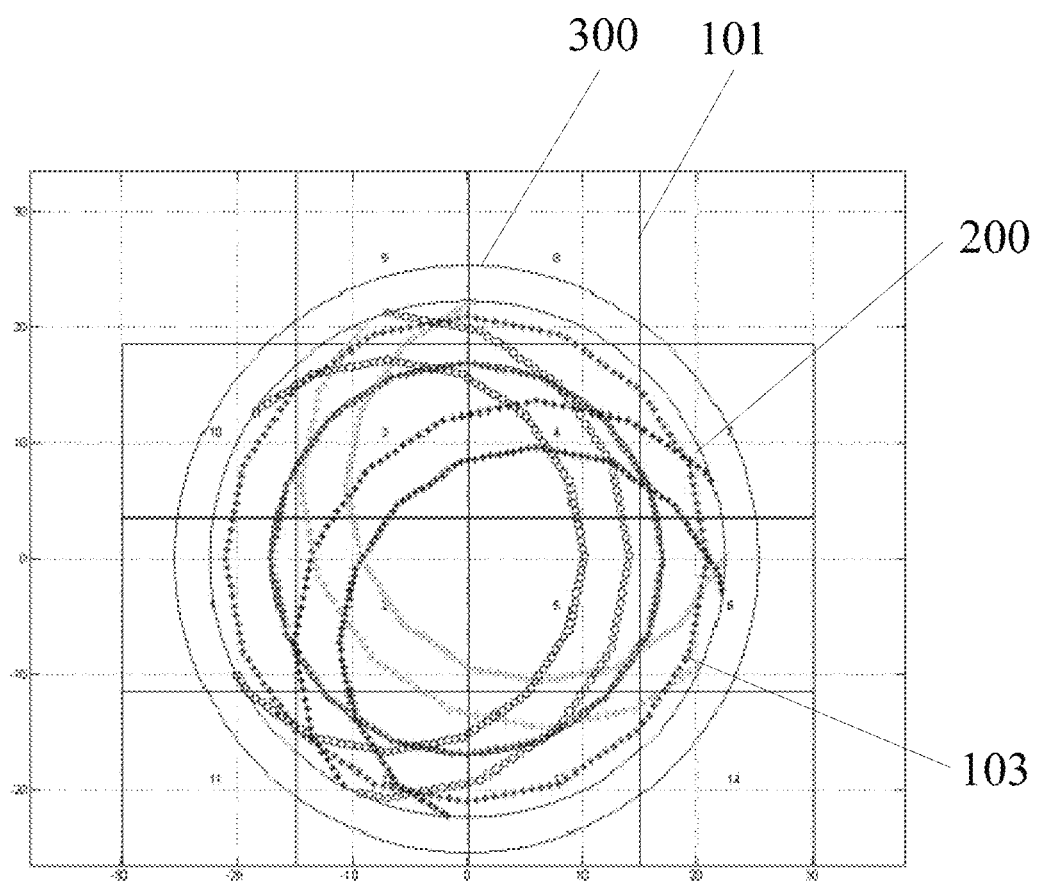
FIG. 6 is a schematic illustration of a scan path adopting a pattern consisting of curved line segments according to an embodiment of the present invention.
Figure 7:
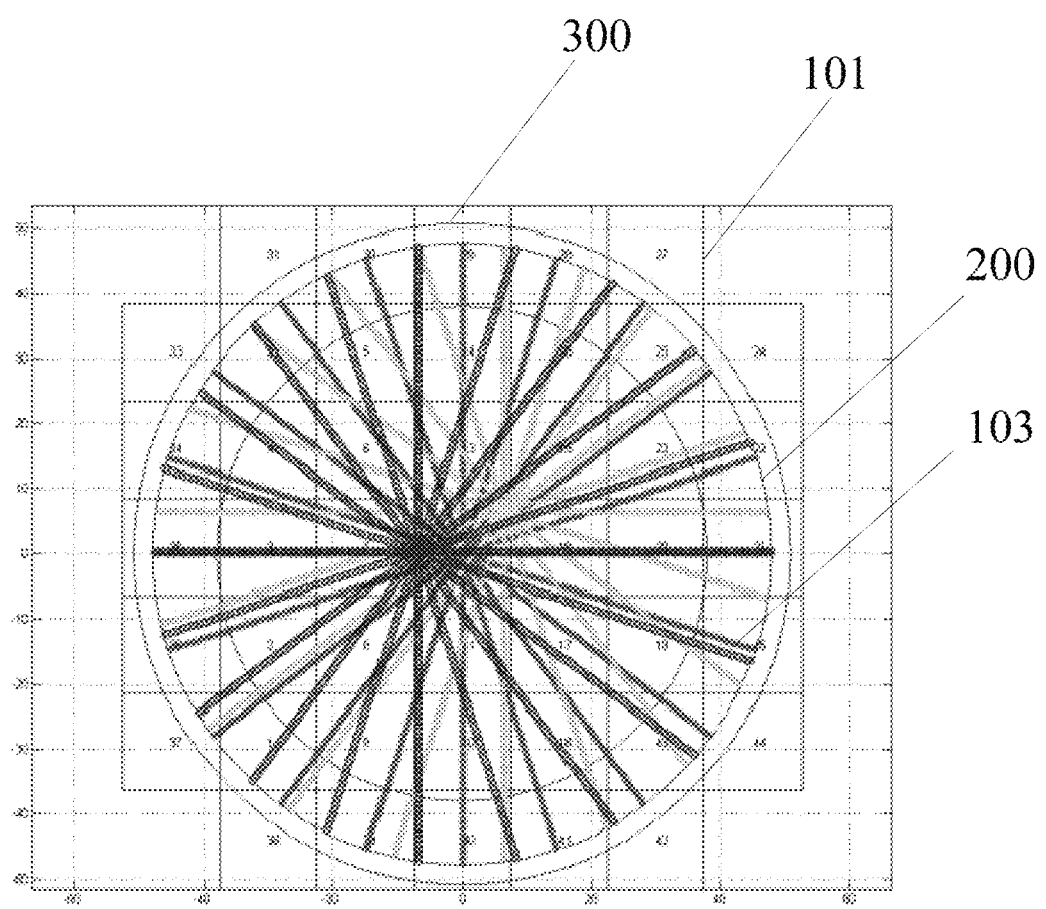
FIG. 7 is a schematic illustration of a scan path adopting starburst pattern according to an embodiment of the present invention.

Referring to FIGS. 1 and 4, the present invention provides a light spot arrangement comprising a plurality of measuring light spots which define at least one set of orthogonal line segments. Those of the measuring light spots lying on the orthogonal line segments radiate outward from a center, with each of the orthogonal line segments defined by at least four of them. These measuring light spots are used to measure the profile of a planar surface. As a specific application example, a light spot-based measuring system is described below.

Specifically, the light spot-based measuring system, in which the light spot arrangement according to the present invention is applied, may include a light spot projector 400, a light spot receiver and a signal processing unit. The light spot projector 400 projects light beams into an exposure field 101 on a wafer 200. The light beams form the light spot arrangement and are reflected. The light spot arrangement comprises at least one set of orthogonal line segments defined by light spots radiating outward from a center. At least four light spots 100 lie on each of the orthogonal line segments. The light spot receiver receives the reflected light beams and produces electrical signals. The signal processing unit processes the electrical signals and thereby obtains positional information indicating a surface profile of the wafer 200.

Preferably, each individual light spot 100 in the light spot arrangement may be selected to be valid or not. In this way, desired ones of them can be designated as valid light spots. The designation may be accomplished in a hardware or software manner. The light spots 100 in the light spot arrangement may radiate outward from the center in an equidistant manner.

Figure 2:
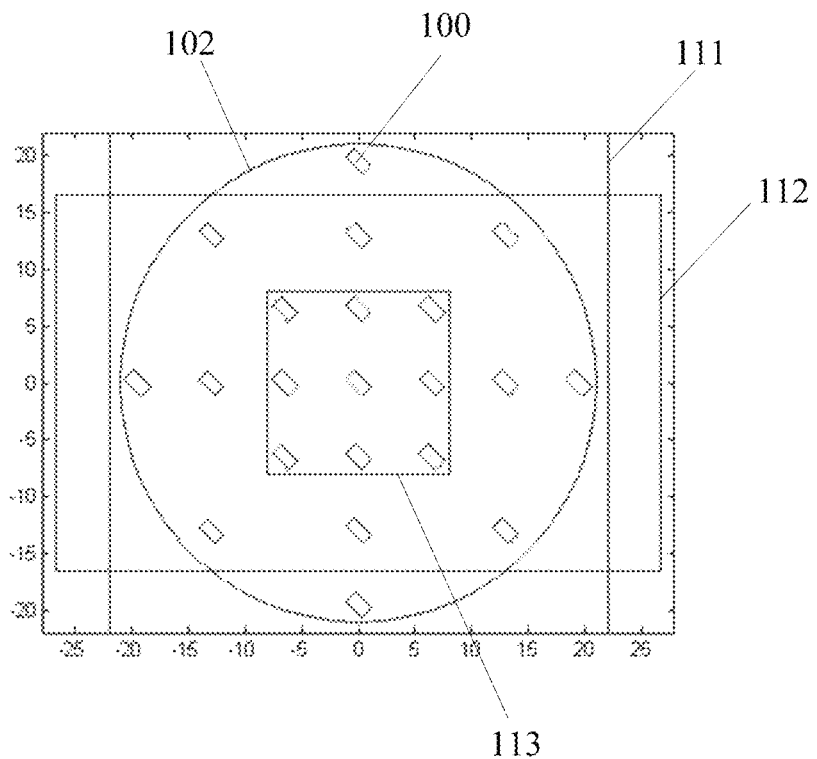
FIG. 2 is another schematic illustration of the light spot arrangement adopting the shape of the union jack according to an embodiment of the present invention.
Figure 11:
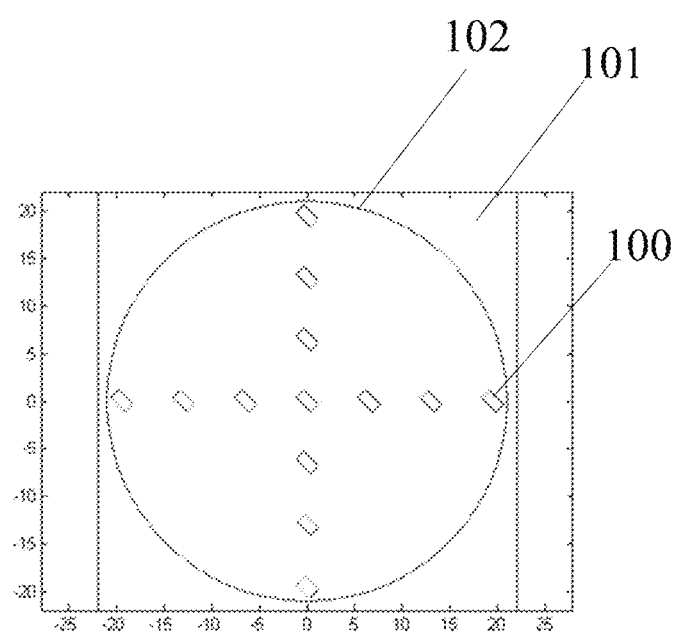
FIG. 11 is a schematic illustration of a light spot arrangement adopting a shape of a greek cross according to an embodiment of the present invention.
Figure 12:
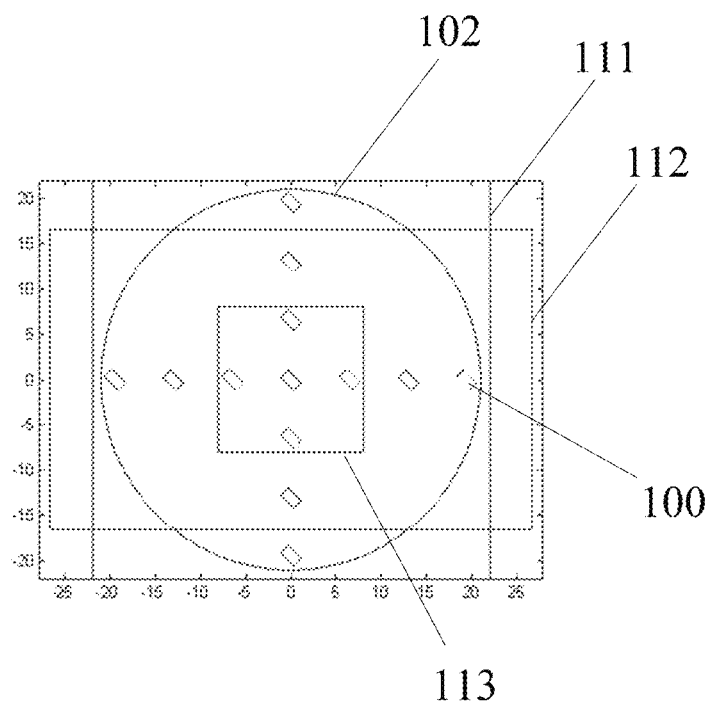
FIG. 12 is another schematic illustration of the light spot arrangement adopting the shape of a greek cross according to an embodiment of the present invention.
Figure 13:
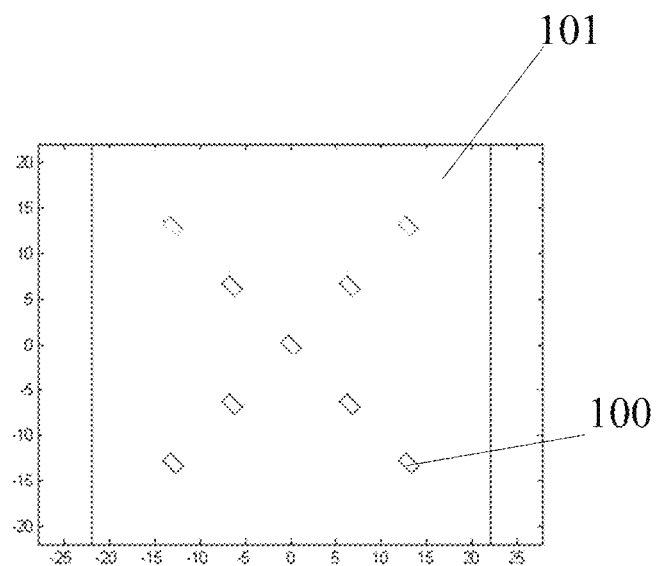
FIG. 13 is a schematic illustration of a light spot arrangement adopting a shape of the letter "X" according to an embodiment of the present invention.
Figure 14:
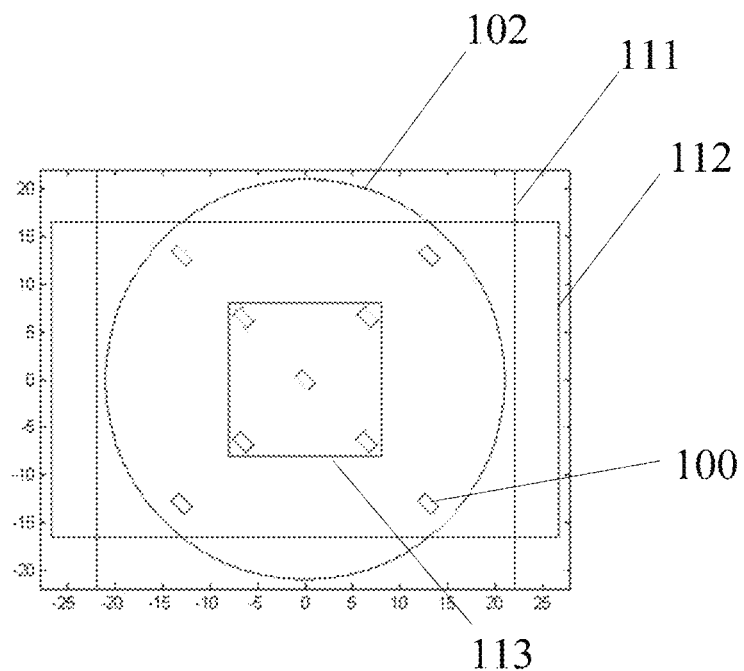
FIG. 14 is another schematic illustration of the light spot arrangement adopting the shape of the letter "X" according to an embodiment of the present invention.
Figure 15:
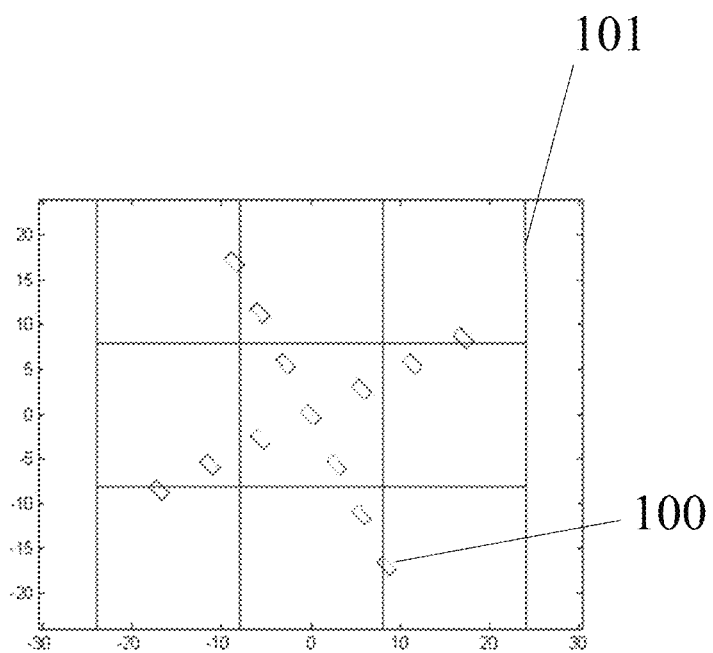
FIG. 15 is a schematic illustration of a light spot arrangement adopting a shape of a rotated cross according to an embodiment of the present invention.
Figure 16:
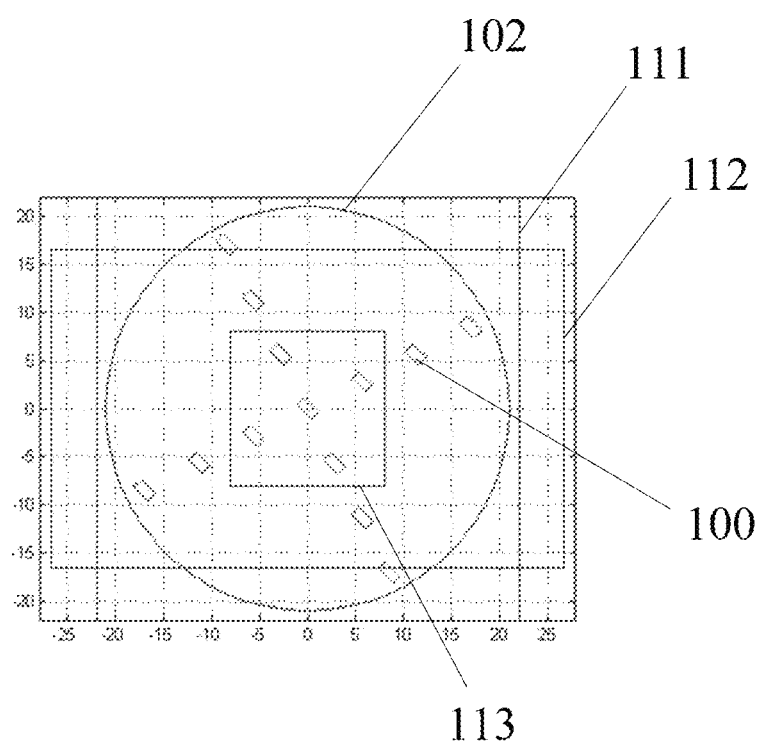
FIG. 16 is another schematic illustration of the light spot arrangement adopting the shape of the rotated cross according to an embodiment of the present invention.

Specifically, depending on the hardware configuration, the light spot arrangement may adopt a shape of the "Union Jack" (FIGS. 1 and 2), a Greek cross (FIGS. 11 and 12), the letter "X" (FIGS. 13 and 14) or a rotated cross (FIGS. 15 and 16). In other words, based on different practical needs, different light spot projectors 400 may be accordingly equipped to meet requirements of various scenes. It is to be noted that the dimensions shown in FIGS. 1 to 2, 5 to 8 and 10 to 16 are intended merely for the purpose of illustration without imposing any specific limitation on the structural characteristics. All the light spots 100 may be distributed within an illumination field 102 of the light spot projector.

The union jack pattern may be transformed to a greek cross or the letter "X" by designating some of the light spots 100 in the union jack pattern as invalid light spots in a software manner. Therefore, the union jack pattern has better applicability.

Preferably, the light spot arrangement may adopt a shape of the rotated cross which is a greek cross rotated by an angle of 18°-35°.

The patterns enumerated above are merely several preferred embodiments of the light spot arrangement of the present invention, and more embodiments can be obtained by making proper modifications to them within the scope of the present invention.

Preferably, the number of measuring light spots lying on each of the line segments may be changed through designating valid ones out of the measuring light spots in the light spot arrangement in a hardware or software manner to address the needs of practical exposure fields 101 of different sizes (e.g., the first exposure field 111, the second exposure field 112 and the third exposure field 113 of FIGS. 2, 12, 14 and 16).

A surface profile measuring method according to the present invention employs the light spot arrangement as defined above and includes the steps of: 1) performing an exposure scan by moving a wafer stage 300, obtaining readings of valid light spots in the light spot arrangement, and collecting height values and horizontal positions of the light spots 100 at various time instants; and 2) converting the readings of the light spots into coordinate values in a coordinate system of the wafer stage. The coordinate values are taken as original surface profile data.

As an example, real-time focusing and leveling may be performed during exposure in this embodiment. Specifically, after the light spot arrangement including at least one set of orthogonal line segments is formed in the exposure field 101 on the wafer 200, readings of the valid light spots in the light spot arrangement may be obtained in real time. A fitting process may be performed to derive height and tilt data of the surface of the wafer 200, based on which the exposure is performed with focusing and leveling.

Figure 3:
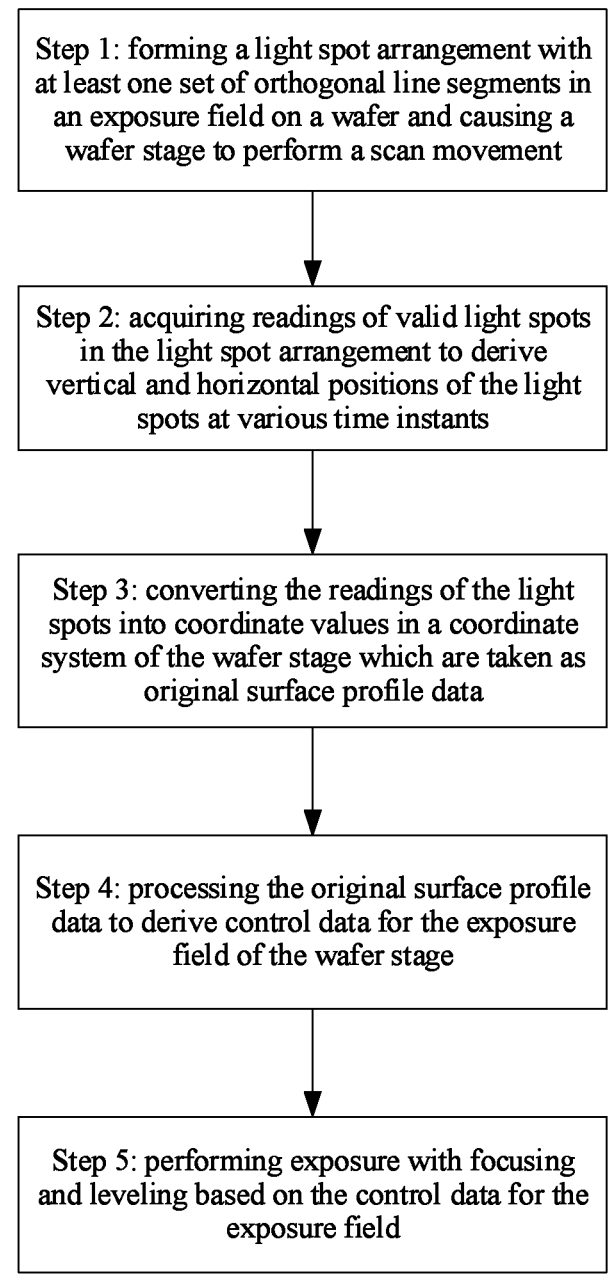
FIG. 3 is a flow chart graphically illustrating a surface profile measuring method according to an embodiment of the present invention.

As an example, the original surface profile data of the wafer 200 are first measured by using the plurality of light spots 100, and then the original surface profile data are processed to obtain motion control data; afterwards, the focusing and leveling is performed. As shown in FIG. 3, the method may comprise:

Step 1, referring to FIG. 4, forming the light spot arrangement including at least one set of orthogonal line segments in the exposure field 101 on the wafer 200; causing the wafer stage 300 to perform a scan movement while being maintained in terms of height and tilt; and acquiring readings of light spots in the light spot arrangement to derive height values and horizontal positions of the light spots 100 at various time instants. The scan may follow a path 103 adopting a grid-like pattern (FIG. 5), a pattern consisting of curved line segments (FIG. 6), a starburst pattern (FIG. 7) or the like. In case of the grid-like pattern, the wafer stage 300 advances along lines of the grid until all the exposure fields 101 of the wafer 200 to be exposed have been traversed. In case of the pattern consisting of curved line segments, the wafer stage 300 advances tortuously until all the exposure fields 101 of the wafer 200 to be exposed have been traversed. In case of the starburst pattern, the wafer stage 300 advances obliquely until all the exposure fields 101 of the wafer 200 to be exposed have been traversed.

The light spots from which the readings are acquired are valid light spots designated out of the measuring light spots 100 in a software or hardware manner.

Figure 8:
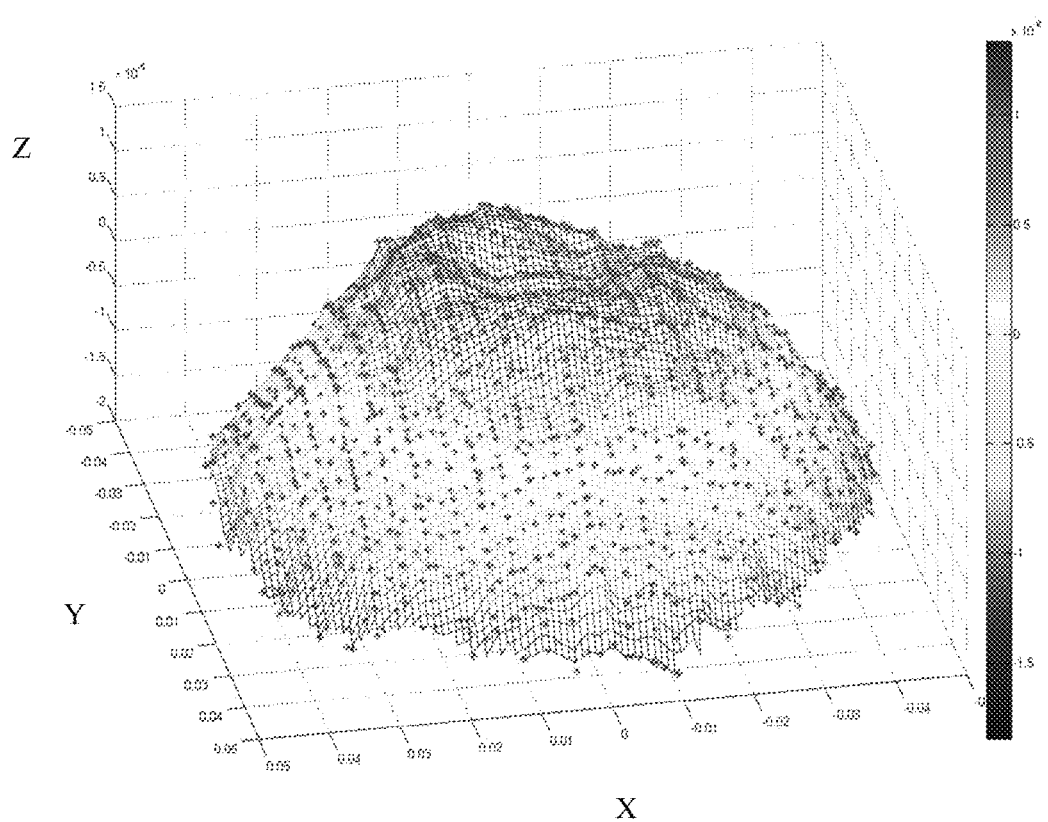
FIG. 8 is a diagram showing a three-dimensional representation of original surface profile data obtained by the light-spot based measuring system in accordance with an embodiment of the present invention.

Step 2, converting the readings of the light spots into coordinate values in a coordinate system of the wafer stage. The coordinate values are taken as the original surface profile data of the scan measurement using the light spots 100. FIG. 8 is a diagram showing a three-dimensional representation of the original surface profile data of the wafer 200.

Horizontal positions indicated in the readings of the light spots may be converted into horizontal coordinate values in the coordinate system of the wafer stage according to the following equations (Eqns. 1 and 2):

$$X_{[n][i]}=X_{WS[n]}+X_{spot[i]} \quad \text{(Eqn. 1)}$$

$$Y_{[n][i]}=Y_{WS[n]}+Y_{spot[i]} \quad \text{(Eqn. 2)}$$

where, $X_{WS[n]}$ and $Y_{WS[n]}$ respectively denote horizontal X-position and horizontal Y-position of a center of the exposure field at the n-th time instant; $X_{spot[i]}$ and $Y_{spot[i]}$ respectively denote horizontal X-position and horizontal Y-position of the i-th light spot relative to the center of the exposure field; and $X_{[n][i]}$ and $Y_{[n][i]}$ denote horizontal coordinate values of the i-th light spot in the coordinate system of the wafer stage at the n-th time instant.

In addition, height values in the readings of the light spots may be converted into vertical coordinate values in the coordinate system of the wafer stage according to the following equations (Eqns. 3 or 4):

$$Z_{[n][i]}=Z_{WS[n]}+Z_{[n]spot[i]} \quad \text{(Eqn. 3)}$$

in case the wafer stage 300 does not tilt in step 1; or $$Z_{[n][i]}=Z_{WS[n]}+Z_{[n]spot[i]}+Rx_{WS[n]}\times Y_{spot[i]}-Ry_{WS[n]}\times X_{spot[i]} \quad \text{(Eqn. 4)}$$

in case there is a tilt of the wafer stage 300 in step 1, where, $Z_{WS[n]}$ denotes a vertical position of the center of the exposure field at the n-th time instant; $Z_{[n]spot[i]}$ denotes a measured height value of the i-th light spot at the n-th time instant; $Rx_{WS[n]}$ and $Ry_{WS[n]}$ respectively denote X-tilt and Y-tilt of the exposure field on the wafer stage at the n-th time instant; $X_{spot[i]}$ and $Y_{spot[i]}$ respectively denote the horizontal X-position and horizontal Y-position of the i-th light spot relative to the center of the exposure field; and $Z_{[n][i]}$ denotes a measured height value of the i-th light spot in the coordinate system of the wafer stage at the n-th time instant.

With this surface profile measuring method, it is unnecessary to take into account whether readings of the light spots 100 are valid. Therefore, the scan is allowed to be performed inward from beyond the wafer edge at a higher scanning speed. Moreover, deceleration to zero velocity near the wafer edge is not required. As a result, the profile measuring efficiency is improved and adaptation to various edge conditions is achieved.

Step 3, processing the original surface profile data to derive control data for the exposure field 101 of the wafer stage 300 and carrying out exposure with focusing and leveling based on the control data for the exposure field 101.

Figure 9:
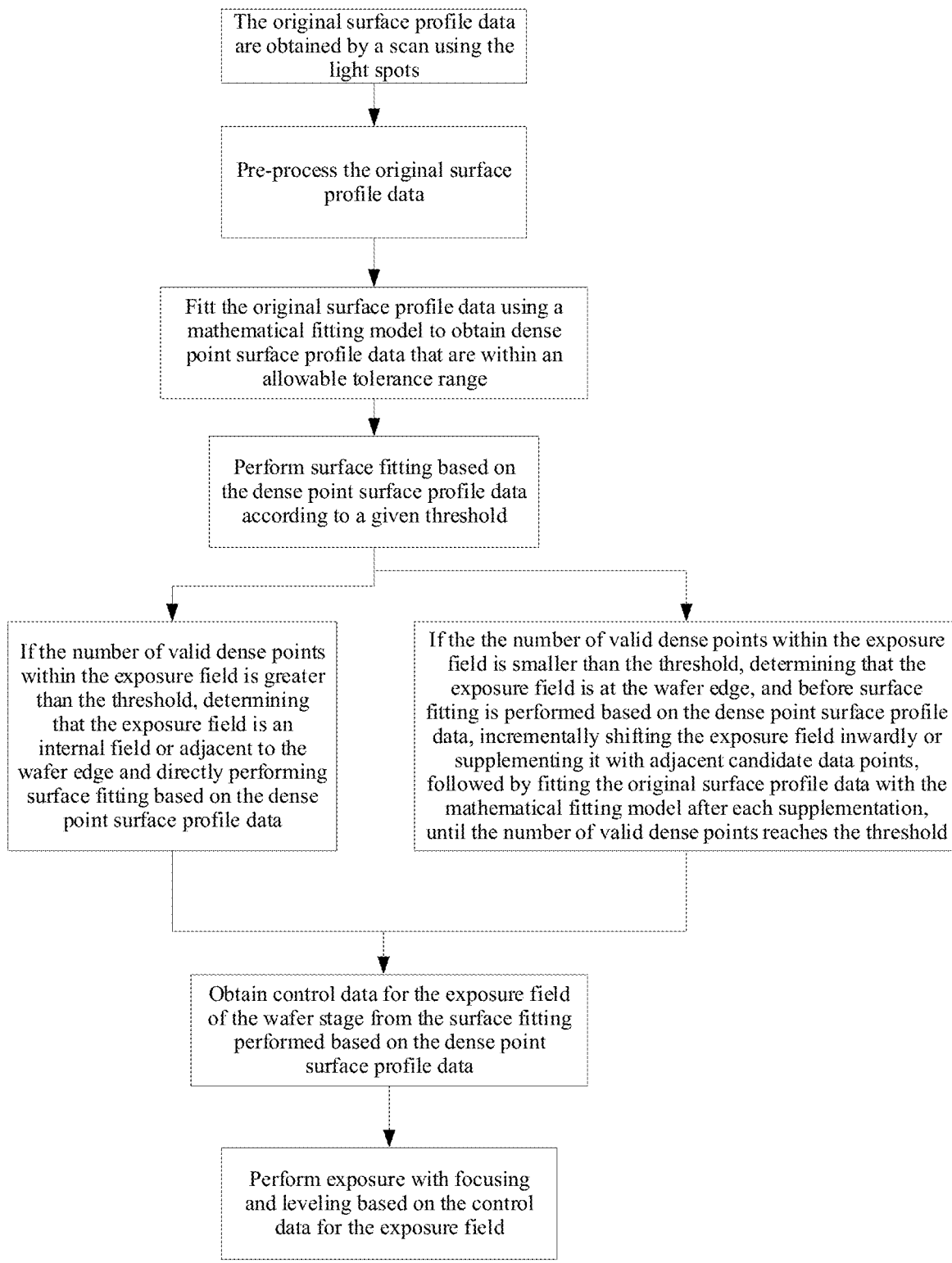
FIG. 9 is a flow chart graphically illustrating how the original surface profile data are processed in accordance with an embodiment of the present invention.

Specifically, with reference to FIG. 9, derivation of the control data for the exposure field 101 of the wafer stage 300 by processing the original surface profile data may include:

1) pre-processing of the original surface profile data, including removal of extreme values and the like;

2) fitting the original surface profile data using a mathematical fitting model to obtain, from the original surface profile data, dense point surface profile data that are within an allowable tolerance range, wherein the allowable tolerance is intended to mean that a deviation between the surface profile obtained in this method and a surface profile determined from actual dense sampling is within an allowable range, and wherein the mathematical fitting model may be a linear interpolation model, high-order surface fitting model or a Zernike model;

3) performing surface fitting based on the dense point surface profile data according to a given threshold. If the number of valid dense points within an exposure field 101 is greater than the threshold, it is determined that the exposure field 101 is an internal field or an edge field that is adjacent to the internal area, and surface fitting is directly performed based on the corresponding dense point surface profile data. Otherwise, if the number of valid dense points within an exposure field 101 is smaller than the threshold, it is determined that the exposure field 101 is at the wafer edge. In this case, the exposure field is incrementally shifted inward or supplemented with adjacent candidate data points and each supplementation is followed by fitting the original surface profile data with the mathematical fitting model until the number of valid dense points reaches the threshold. After that, a surface fitting is performed based on the corresponding dense point surface profile data.

The surface fitting is given by:

$$Z=Z_0-Ry\times X+Rx\times Y$$

wherein, X, Y and Z denote dense point surface profile data; $Z_0$ denotes the vertical position of the surface profile in the exposure field; Rx denotes the X-tilt of the surface profile in the exposure field; Ry denotes the Y-tilt of the surface profile in the exposure field; and $Z_0$, Rx and Ry denote control data for the exposure field derived from proper conversion.

Figure 10:
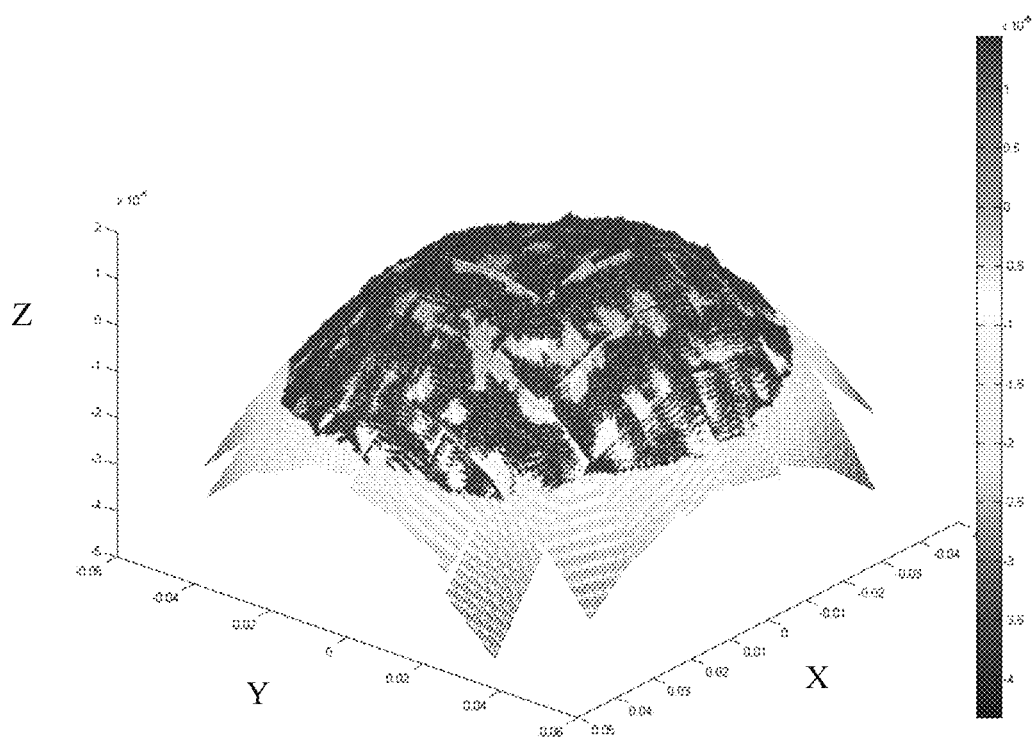
FIG. 10 is a diagram showing a three-dimensional representation of the processed original surface profile data.

FIG. 10 is a diagram showing a three-dimensional representation of the original surface profile data that have been processed by the foregoing method.

According to the above method, the control data for the exposure field 101 of the wafer stage 300 are not obtained directly using the original surface profile data. Rather, a mathematical fitting model is employed to obtain a more granular surface profile based on the original surface profile data. This can effectively reduce errors arising from an uneven distribution of spatial samples, allowing a smaller deviation in the calculation of the control data. Moreover, more freedom is allowed in the selection of the scan path for the surface profile measuring and it is therefore possible to use a more efficient scan path. As a result, defocus will be prevented or reduced in the exposure field 101 for the processing of wafer edge under the condition of a limited available DOF or edge warpage. Therefore, wafer surface profile measuring with enhanced adaptability, improved exposure consistency and stability and higher process adaptability can be achieved.

According to the present invention, use of the light spot arrangement comprising at least one set of orthogonal line segments not only allows readings of light spots 100 therein to be acquired in real time but also enables the exposure to be performed with real-time focusing and leveling based on a surface profile of the wafer 200 containing height and tilt data obtained from a surface fitting procedure. Moreover, each individual light spot 100 in the light spot arrangement can be set to be valid or invalid as desired, making the arrangement adaptive to exposure fields 101 of different sizes. During a scan movement performed by the wafer stage 300, readings of valid light spots are obtained and converted into coordinate values in the coordinate system of the wafer stage which are taken as original surface profile data of the scan measurement of the wafer stage. The original surface profile data are then processed to derive control data for the exposure field 101 of the wafer stage 300, which serve as a basis for the exposure with focusing and leveling. In this process, as it is unnecessary to take into account whether readings of all the light spots 100 are valid during the scanning of the wafer edge, the scan can be performed at a higher speed, resulting in an improvement in scanning efficiency. Therefore, the present invention allows both real-time measurement and scanning measurement of surface profile and is thus more versatile and adaptive.

What is claimed is:

1. A surface profile measuring method, comprising the steps of:
    1) forming a light spot arrangement in an exposure field of a wafer, wherein the light spot arrangement comprises a plurality of measuring light spots which define only a pattern of a slash, a backslash, a greek cross, a union jack or a letter X, wherein each of the pattern of the slash, the backslash, the greek cross, the union jack or the letter X has a center on which one of the plurality of measuring light spots is located; causing the wafer stage to perform an exposure scan movement with a height and a tilt of the wafer stage remaining unchanged, until all the exposure fields of the wafer including edges of the wafer have been scanned; during the exposure scan movement, obtaining readings of each of the measuring light spots in the light spot arrangement, and collecting height values and horizontal positions of each of the measuring light spots at different time instants; and
    2) converting the readings of each of the measuring light spots into coordinate values in a coordinate system of the wafer stage, and taking the coordinate values as original surface profile data.

2. The surface profile measuring method of claim 1, wherein the measuring light spots radiate outward from the center in an equidistant manner.

3. The surface profile measuring method of claim 1, wherein some or all of the measuring light spots are designated as valid light spots based on a validity of each measuring light spot, and wherein the readings of the measuring light spots are obtained from the valid light spots.

4. The surface profile measuring method of claim 3, wherein the validity of the measuring light spot is designated in a hardware or software manner.

5. The surface profile measuring method of claim 1, wherein in step 1, the exposure scan movement is performed following a path adopting a grid-like pattern, a pattern consisting of curved line segments or a starburst pattern.

6. The surface profile measuring method of claim 1, wherein in step 2, the horizontal positions in the readings of the measuring light spots are converted to horizontal coordinate values in the coordinate system of the wafer stage according to following Equations 1 and 2:

$$X_{[n][i]}=X_{WS[n]}+X_{spot[i]} \quad \text{(Eqn. 1)}$$

$$Y_{[n][i]}=Y_{WS[n]}+Y_{spot[i]} \quad \text{(Eqn. 2)}$$

where, $X_{WS[n]}$ and $Y_{WS[n]}$ respectively denote horizontal X-position and horizontal Y-position of a center of an exposure field at a n-th time instant, $X_{spot[i]}$ and $Y_{spot[i]}$ respectively denote horizontal X-position and horizontal Y-position of an i-th light spot relative to the center of the exposure field, $X_{[n][i]}$ and $Y_{[n][i]}$ respectively denote horizontal coordinate values of the i-th light spot in the coordinate system of the wafer stage at the n-th time instant, wherein n and i are both natural numbers.

7. The surface profile measuring method of claim 1, wherein in step 2, the height values in the readings of the measuring light spots are converted to vertical coordinate values in the coordinate system of the wafer stage according to following Equation 3 or Equation 4:

$$Z_{[n][i]}=Z_{WS[n]}+Z_{[n]spot[i]} \quad \text{(Eqn. 3)}$$

if the wafer stage does not tilt in step 1; or $$Z_{[n][i]}=Z_{WS[n]}+Z_{[n]spot[i]}+Rx_{WS[n]} \times Y_{spot[i]}-Ry_{WS[n]} \times X_{spot[i]} \quad \text{(Eqn. 4)}$$

if there is a tilt of the wafer stage in step 1,
where, $Z_{WS[n]}$ denotes a vertical position of a center of the an exposure field at a n-th time instant, $Z_{[n]\ spot[i]}$ denotes a measured height value of an i-th measuring light spot at the n-th time instant, $Rx_{WS[n]}$ and $Ry_{WS[n]}$ respectively denote X-tilt and Y-tilt of the center of the exposure field at the n-th time instant, $X_{spot[i]}$ and $Y_{spot[i]}$ respectively denote horizontal X-position and Y-position of the i-th light spot relative to the center of the exposure field, $Z_{[n][i]}$ denotes a measured height value of the i-th light spot in the coordinate system of the wafer stage at the n-th time instant, wherein n and i are both natural numbers.

8. The surface profile measuring method of claim 1, wherein the greek cross that is rotated counterclockwise by an angle ranging from 18° to 35°.

9. A method for calculating control data for an exposure field, comprising using the surface profile measuring method as defined in claim 1 to obtain the original surface profile data, and processing the original surface profile data to obtain the control data of the exposure field for the wafer stage, the processing comprising the steps of:
    3) fitting the original surface profile data using a mathematical fitting model to obtain dense point surface profile data that are within an allowable tolerance range; and
    4) performing surface fitting based on the dense point surface profile data according to a predetermined threshold, wherein if a number of valid dense points within the exposure field is greater than the threshold, the surface fitting is directly performed based on the corresponding dense point surface profile data; otherwise, if a number of valid dense points within the exposure field is smaller than the threshold, before the surface fitting is performed based on the corresponding dense point surface profile data, the exposure field is incrementally shifted inward or supplemented with adjacent candidate data points and each supplementation is followed by fitting the original surface profile data with the mathematical fitting model until the number of valid dense points reaches the threshold.

10. The method for calculating control data for an exposure field of claim 9, further comprising, prior to step 3, pre-processing of the original surface profile data, wherein the pre-processing includes removal of extreme values.

11. The method of claim 9 for calculating control data for an exposure field, wherein in step 3, the mathematical fitting model is a linear interpolation model, a high-order surface fitting model or a Zernike model.

12. The method for calculating control data for an exposure field of claim 9, wherein the surface fitting in step 4 is given by:

$$Z=Z_0-Ry \times X+Rx \times Y$$

wherein, X, Y and Z denote dense point surface profile data; $Z_0$ denotes the vertical position of the surface profile in the exposure field; Rx denotes a X-tilt of the surface profile in the exposure field; Ry denotes a Y-tilt of the surface profile in the exposure field; and $Z_0$, Rx and Ry denote control data for the exposure field derived from proper conversion.

\* \* \* \* \*